United States Patent
Chen et al.

(10) Patent No.: US 7,884,914 B2
(45) Date of Patent: Feb. 8, 2011

(54) STRUCTURE FOR ENCAPSULATING A LIQUID CRYSTAL DISPLAY DEVICE

(75) Inventors: Kun-Hong Chen, Danshuei Township, Taipei County (TW); Chang-Cheng Lo, Minsyong Township, Chiayi County (TW); Tzu-Wei Ho, Fongshan (TW)

(73) Assignee: AU Optronics Corp., Hsinchu (TW)

( * ) Notice: Subject to any disclaimer, the term of this patent is extended or adjusted under 35 U.S.C. 154(b) by 797 days.

(21) Appl. No.: 11/268,843

(22) Filed: Nov. 8, 2005

(65) Prior Publication Data
US 2006/0057334 A1 Mar. 16, 2006

Related U.S. Application Data

(63) Continuation-in-part of application No. 10/782,259, filed on Feb. 18, 2004, now abandoned.

(51) Int. Cl.
*G02F 1/1339* (2006.01)
(52) U.S. Cl. .................. 349/153; 349/190; 277/312; 277/316; 277/641; 277/904; 428/1.6; 428/1.62
(58) Field of Classification Search ............... 428/1.53, 428/1.6, 1.62, 138, 139, 122, 131, 137, 1.1, 428/1.5, 637–640, 194; 349/153, 154, 190; 277/312, 305, 341, 345, 269, 904, 316, 596, 277/605, 641; 383/38; D23/269
See application file for complete search history.

(56) References Cited

U.S. PATENT DOCUMENTS

| 1,862,297 | A | * | 6/1932 | Butler | 361/307 |
| 4,390,104 | A | * | 6/1983 | Cummings | 215/232 |
| 5,672,408 | A | * | 9/1997 | Kikinis | 428/138 |
| 6,016,180 | A | * | 1/2000 | Bradshaw et al. | 349/156 |
| 6,118,510 | A | * | 9/2000 | Bradshaw et al. | 349/156 |
| 6,177,975 | B1 | * | 1/2001 | Buchwalter et al. | 349/187 |

(Continued)

FOREIGN PATENT DOCUMENTS

JP 9033933 2/1997

(Continued)

OTHER PUBLICATIONS

Alphonsus V. Pocius, "Adhesive", in AccessScience@McGraw-Hill, http://www.accessscience.com, DOI 10.1036/1097-8542.011000, No Year.*

(Continued)

*Primary Examiner*—Callie E Shosho
*Assistant Examiner*—Nicholas Kokkinos
(74) *Attorney, Agent, or Firm*—Thomas, Kayden, Horstemeyer & Risley (57) ABSTRACT

A structure for encapsulating a liquid crystal display device is disclosed. Openings are formed in a second material layer on a first substrate, exposing an underlying first material layer. The openings are substantially distributed over the perimeter of the first substrate. A sealant is placed in the openings, forming a sealant region for attachment of a second substrate to the first substrate. The sealant region is substantially perpendicular to a direction of length of the openings. In addition, the sealant contacts the first material layer and the second material layer through the openings.

5 Claims, 7 Drawing Sheets

U.S. PATENT DOCUMENTS

| | | | |
|---|---|---|---|
| 6,317,186 B1* | 11/2001 | Miwa et al. | 349/153 |
| 7,443,481 B2* | 10/2008 | Wu et al. | 349/190 |
| 7,630,050 B2* | 12/2009 | Kobayashi et al. | 349/153 |
| 2001/0008434 A1* | 7/2001 | Battersby et al. | 349/38 |
| 2001/0012088 A1* | 8/2001 | Jeong | 349/153 |
| 2002/0012080 A1* | 1/2002 | Ishihara et al. | 349/43 |
| 2002/0030769 A1* | 3/2002 | Bae | 349/43 |
| 2002/0030783 A1* | 3/2002 | Taniguchi | 349/153 |
| 2002/0051112 A1* | 5/2002 | Katsura | 349/153 |
| 2002/0060768 A1* | 5/2002 | Chung et al. | 349/139 |
| 2003/0117568 A1* | 6/2003 | Chin et al. | 349/153 |
| 2004/0152243 A1* | 8/2004 | Kuroda et al. | 438/129 |
| 2005/0110937 A1* | 5/2005 | Yoon et al. | 349/153 |
| 2006/0114400 A1* | 6/2006 | Hung et al. | 349/141 |
| 2008/0030670 A1* | 2/2008 | Ishii et al. | 349/153 |

FOREIGN PATENT DOCUMENTS

| | | |
|---|---|---|
| JP | 10301124 | 11/1998 |
| JP | 2000347173 | 12/2000 |
| JP | 2002-333639 | 11/2002 |

OTHER PUBLICATIONS

James H. Calderwood, "Dielectric materials", in AccessScience@McGraw-Hill, http://www.accessscience.com, DOI 10.1036/1097-8542.192850, No Year.*

English Abstract of JP2000347173.

English Abstract of JP9033933.

* cited by examiner

FIG. 5

STRUCTURE FOR ENCAPSULATING A LIQUID CRYSTAL DISPLAY DEVICE

This application is a continuation-in-part application of U.S. patent application Ser. No. 10/782,259, filed Feb. 18, 2004, now abandoned.

BACKGROUND

The invention relates to a thin film transistor liquid crystal display (TFT LCD) device and in particular to a sealant region for encapsulating a liquid crystal display device.

A TFT LCD device is driven by voltage to emit light, and may be transmissive, reflective, or transflective.

A TFT LCD device suffers from degradation issues related to ambient environmental conditions such as moisture which may lead to performance loss, operational instability, poor color/emission accuracy, and shortened operational life. Specifically, water can cause crystallization and formation of organic solids, electrochemical reactions at the electrode-organic layer interface, corrosion of metals and migration of ionic species. To minimize such degradation, a TFT LCD device must be properly encapsulated to prevent moisture migration. Typical encapsulation methods utilize a color filter substrate covering the entire organic polymer areas with an adhesive sealant.

Figure 1A:
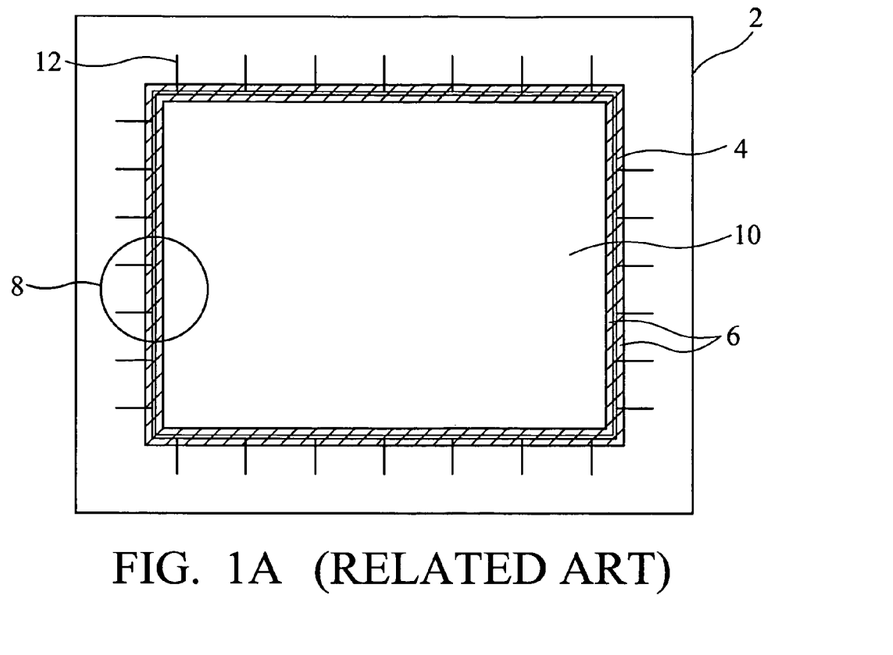
FIG. 1A is a top view of a sealant region of a conventional TFT LCD device.

FIG. 1A is a top view of a sealant region of a conventional TFT LCD device.

As shown in FIG. 1A, a color filter substrate 10 is disposed over a TFT array substrate 2. Openings 4 are formed within a sealant region 6 distributed over the perimeter of the TFT array substrate 2. A sealant 14, as shown in FIG. 1C, encapsulates a TFT LCD device by contacting the color filter substrate 10 and TFT array substrate 2. Air is exhausted through trenches 12 when the sealant 14 is placed in the openings 4, preventing bubbles from forming in the sealant 14 or liquid crystal. In addition, openings 4 and trenches 12 are interconnected.

Figure 1B:
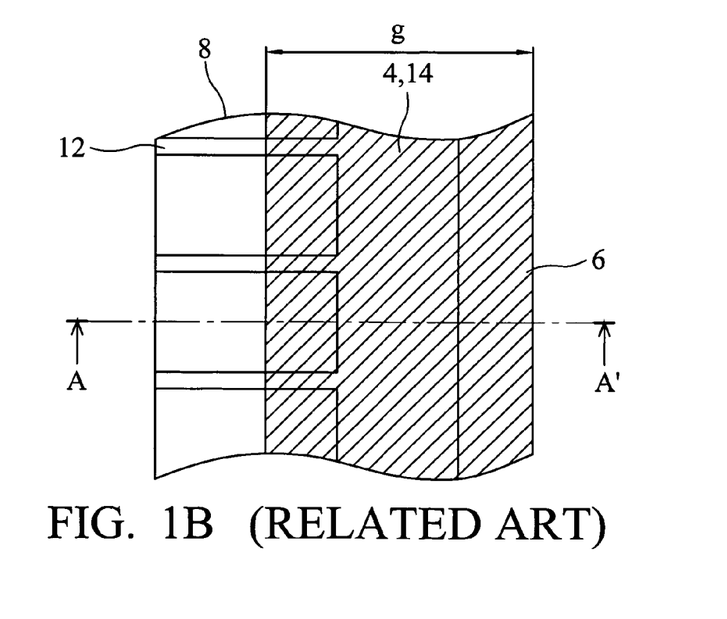
FIG. 1B is an enlarged view of the portion of the sealant region shown in FIG. 1A.
Figure 1C:
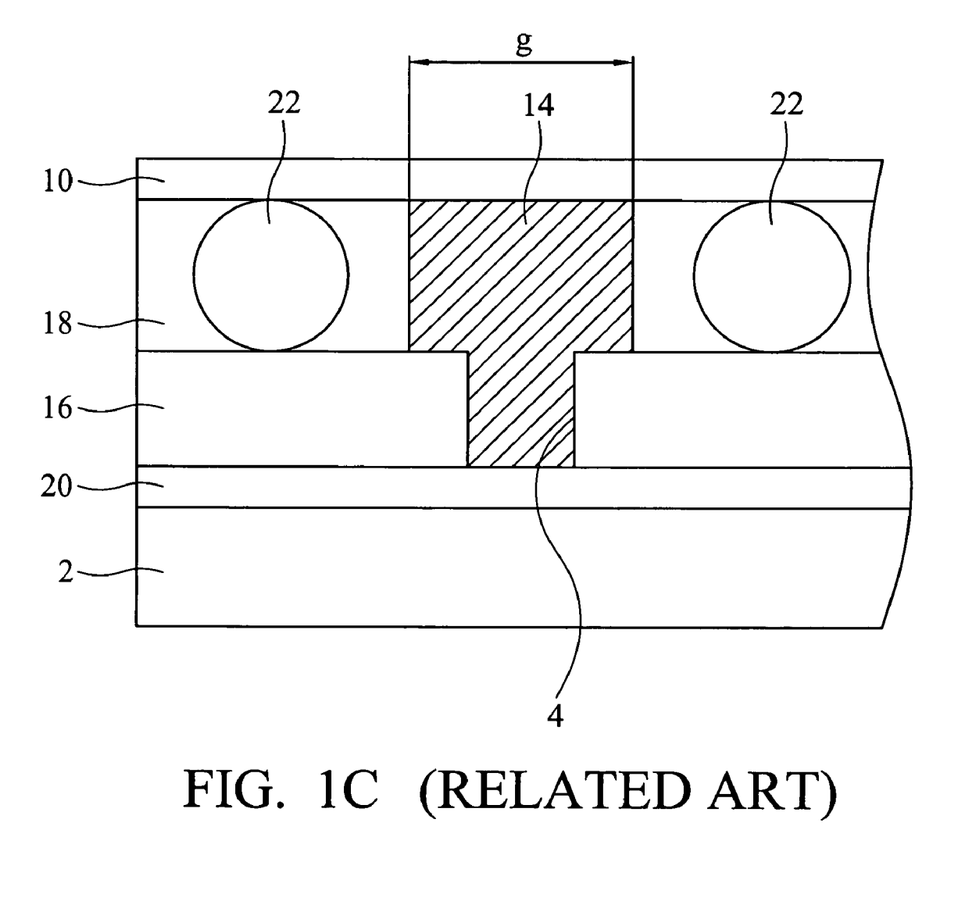
FIG. 1C is a cross-section of the TFT LCD device shown in FIG. 1B along the plane defined by the horizontal dotted line AA'.

FIG. 1B is an enlarged view of the portion 8 of the sealant region shown in FIG. 1A. The sealant width is marked by distance g confined by the two vertical dotted lines.

FIG. 1C is a cross-section of the TFT LCD device shown in FIG. 1B along the plane defined by the horizontal dotted line AA'.

As shown in FIG. 1C, the openings 4 expose portions of the surface of the passivation layer 20, and the sealant 14 is placed in the openings 4. To place the sealant 14 between the TFT array substrate 2 and color filter substrate 10, the organic polymer layer 16 is selectively removed to form the openings 4. When the sealant 14 is placed in the openings 4, certain portions of the sealant 14 will rest on the neighboring and remaining organic polymer layer 16.

As shown in FIG. 1C, a TFT LCD device comprises the TFT array substrate 2, passivation layer 20, organic polymer layer 16, spacers 22 disposed over organic polymer layer 16, sealant 14, liquid crystal 18, and color filter substrate 10. Spacers 22 are disposed between the organic polymer layer 16 and color filter substrate 10 to maintain the cell gap.

The thickness of the sealant between the organic polymer layer 16 and color filter substrate 10 is difficult to apply in a precise manner. Moreover, as shown in FIG. 1C, the sealant must be evenly distributed on the organic polymer layer 16; otherwise defects such as mura will occur.

The large volume and thickness of the applied sealant may also lead to peeling of the sealant from the substrates. Such peeling will result in the loss of encapsulation integrity.

What is desirable is an improved method of encapsulating a TFT LCD device.

SUMMARY

An embodiment of a sealant region for encapsulating a liquid crystal display device is disclosed. Parallel openings are formed in a second material layer on a first substrate, exposing an underlying first material layer. The parallel openings are substantially distributed over the perimeter of the first substrate. A sealant is placed in the openings, forming a sealant region for attaching a second substrate to the first substrate. The sealant region is substantially perpendicular to a direction of length of the openings. In addition, the sealant contacts the first material layer and the second material layer through the openings.

Another embodiment of a sealant region for encapsulating a liquid crystal display device is also disclosed. A sealant region comprising at least one opening having a tab-and-groove pattern is formed by removing portions of a second material layer from a first substrate, exposing an underlying first material layer. A sealant is placed in openings for attachment of a second substrate to the first substrate. Additionally, the sealant in openings is balanced along a central axis of the sealant region.

The invention is less prone to the reliability and integrity issues encountered in the conventional devices. Irregular vertical gaps are avoided, reducing formation of voids in the sealant regions.

The invention also leads to higher throughput, higher integrity, and longer operation life of the disclosed devices.

Problems encountered in conventional devices are reduced by the invention for forming the sealant region. The invention features the use of narrow gap between the organic polymer areas, thereby enhancing adhesion between the color filter substrate and TFT array substrate.

The invention is easily implemented into existing fabrication operations and processes with minimal impact on additional costs and required processes. With such improvements, a facility will maintain highly competitive cost and throughput advantages over other manufacturers of similar products.

A detailed description is given in the following embodiments with reference to the accompanying drawings.

DESCRIPTION OF THE DRAWINGS

The invention can be more fully understood by reading the subsequent detailed description and examples with reference made to the accompanying drawings, wherein.

DETAILED DESCRIPTION

An embodiment of a sealant region for encapsulating a liquid crystal display device is described in greater detail in the following.

Figure 2A:
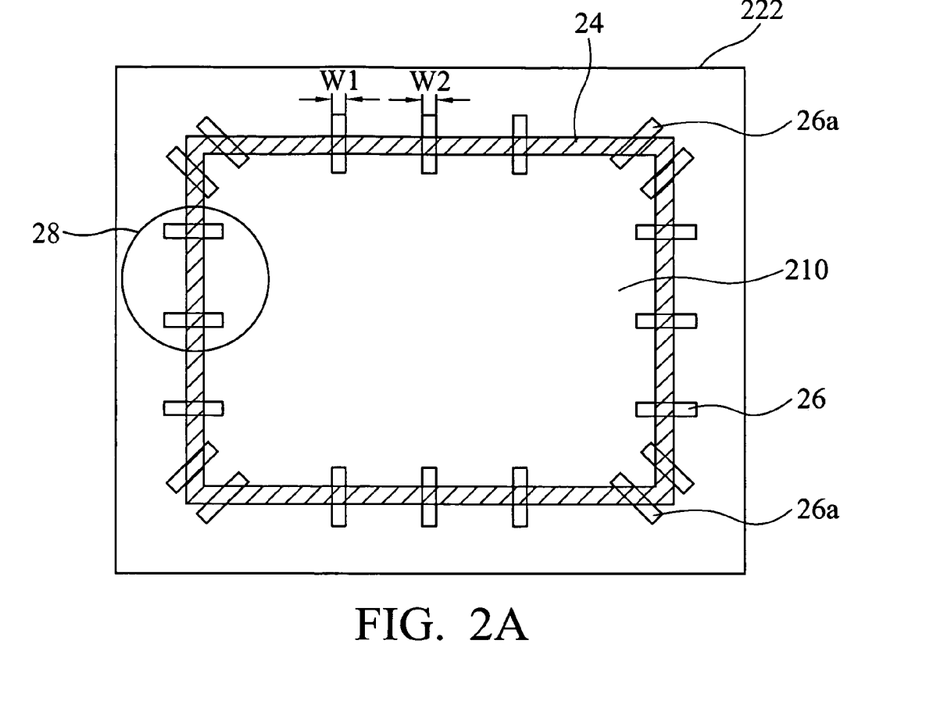
FIG. 2A is a top view of a sealant region of a TFT LCD device according to an embodiment of the invention.

FIG. 2A is a top view of a sealant region of a TFT LCD device according to an embodiment of the invention. The number or size of any component shown in FIG. 2A is specified for purposes of illustration, without intending to limit the disclosure.

As shown in FIG. 2A, a color filter substrate 210 is disposed over a TFT array substrate 222. Roughly parallel openings 26 are formed within a sealant region 24 distributed over the perimeter of the TFT array substrate 222. A sealant 224, shown in FIG. 2C, encapsulates a TFT LCD device by contacting the color filter substrate 210 and TFT array substrate 222. Two openings 26a, formed in the corner regions at an angle of about 45 degrees deviating from the perimeter of the TFT array substrate 222, balance distribution of the sealant.

Figure 2B:
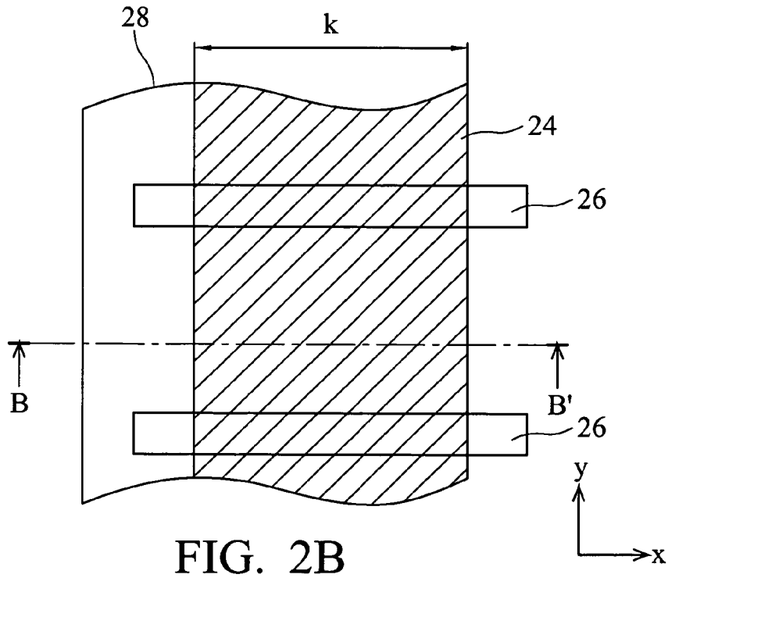
FIG. 2B is an enlarged view of the portion of the sealant region shown in FIG. 2A.

FIG. 2B is an enlarged view of the portion 28 of the sealant region shown in FIG. 2A.

As shown in FIG. 2B, the sealant region 24, extending in a direction y, is substantially perpendicular to a direction x of length of the openings 26. The sealant width is marked by distance k confined by the two vertical dotted lines. The width, marked as w1 or w2 in FIG. 2A, of any opening is less than the sealant width k. The openings 26 may have a roughly uniform width. In other embodiments, the openings 26 may have different widths (not shown).

Figure 2C:
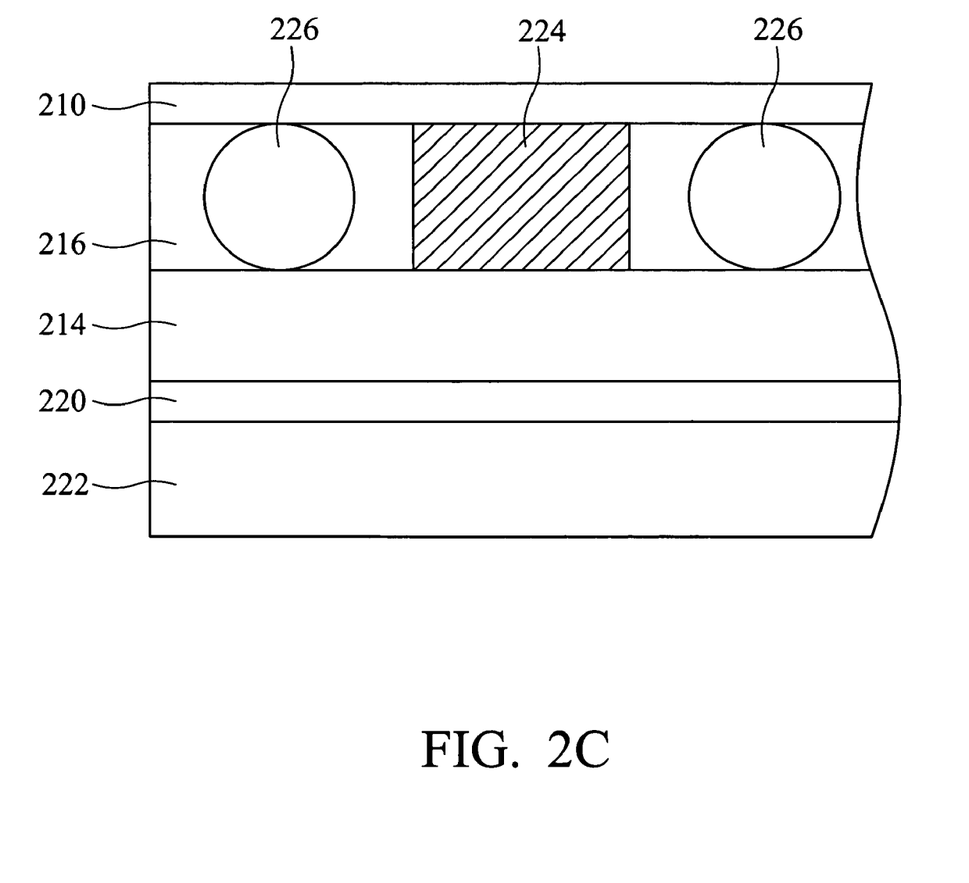
FIG. 2C is a cross-section of the TFT LCD device shown in FIG. 2B along the plane defined by the horizontal dotted line BB'.

FIG. 2C is a cross-section of the TFT LCD device shown in FIG. 2B along the plane defined by the horizontal dotted line BB'.

As shown in FIG. 2C, a TFT LCD device comprises TFT array substrate 222, passivation layer 220, organic polymer layer 214, spacers 226 disposed over organic polymer layer 214, sealant 224, liquid crystal 216, or color filter substrate 210. Spacers 226 are disposed between the organic polymer layer 214 and color filter substrate 210 to maintain the cell gap.

The openings 26 expose portions of the surface of the passivation layer 220, and the sealant 224 is placed in the openings 26 to contact the passivation layer 220. The passivation layer 220 may be a dielectric material layer. To place the sealant 224 between the TFT array substrate 222 and color filter substrate 210, the organic polymer layer 214 is selectively removed to form the openings 26.

With the openings 26 perpendicular to the sealant region 24, the sealant 224 sufficiently contacts the passivation layer 220. Also, the sealant 224 has substantially flat contact surfaces with the organic polymer layer 214 or TFT array substrate 222. Accordingly, problems such as uneven cell gap or peeling are reduced.

Figure 3A:
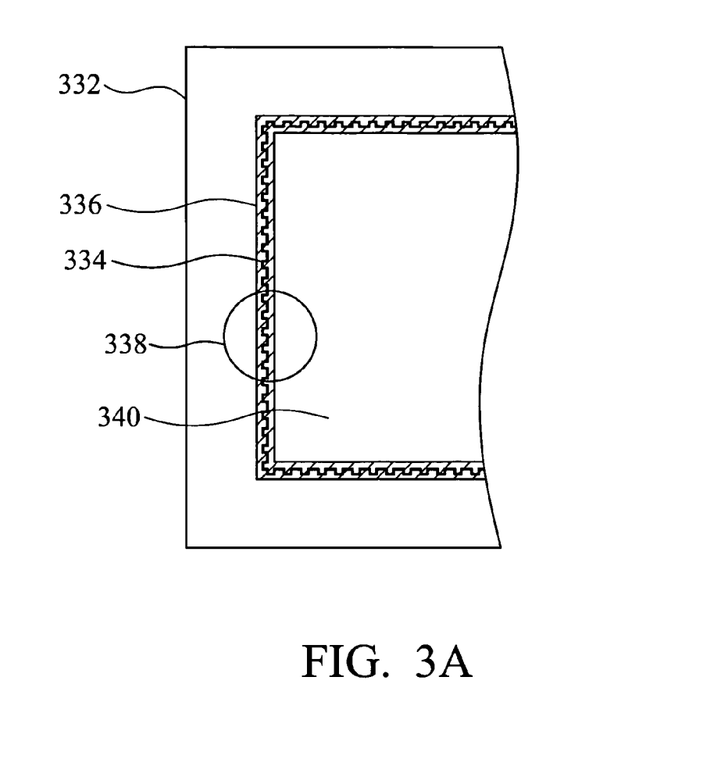
FIG. 3A is a top view of a sealant region of a TFT LCD device according to an embodiment of the invention.

FIG. 3A is a top view of a sealant region of a TFT LCD device according to an embodiment of the invention.

As shown in FIG. 3A, a color filter substrate 340 is disposed over a TFT array substrate 332. Openings 334 are formed within a sealant region 336 distributed over the perimeter of the TFT array substrate 332. A sealant encapsulates the TFT LCD device by contacting the color filter substrate 340 and TFT array substrate 332.

Figure 3B:
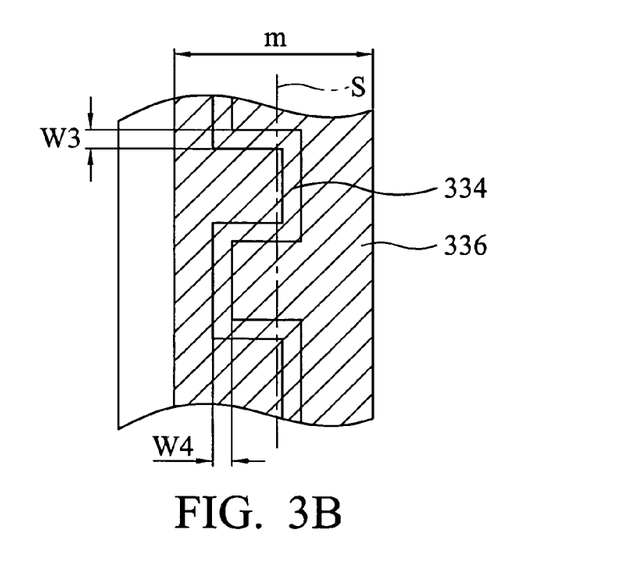
FIG. 3B is an enlarged view of the portion of the sealant region shown in FIG. 3A.

FIG. 3B is an enlarged view of the portion 338 of the sealant region shown in FIG. 3A.

As shown in FIG. 3B, the openings 334 may be formed of small segments with the surface feature such as tabs and grooves. The openings 334 may have a roughly uniform width. In other embodiments, the openings 334 may have different widths (not shown). To avoid uneven cell gap, the width marked as w3 or w4 of any opening 334 is less than the sealant width m. Moreover, with the openings 334, the sealant can be evenly distributed on both sides of a central axis S of the sealant region. The openings 334 are continuous small segments, as shown in FIGS. 3A and 3B. In other embodiments, openings 334 may be not continuous small segments (not shown).

Figure 4:
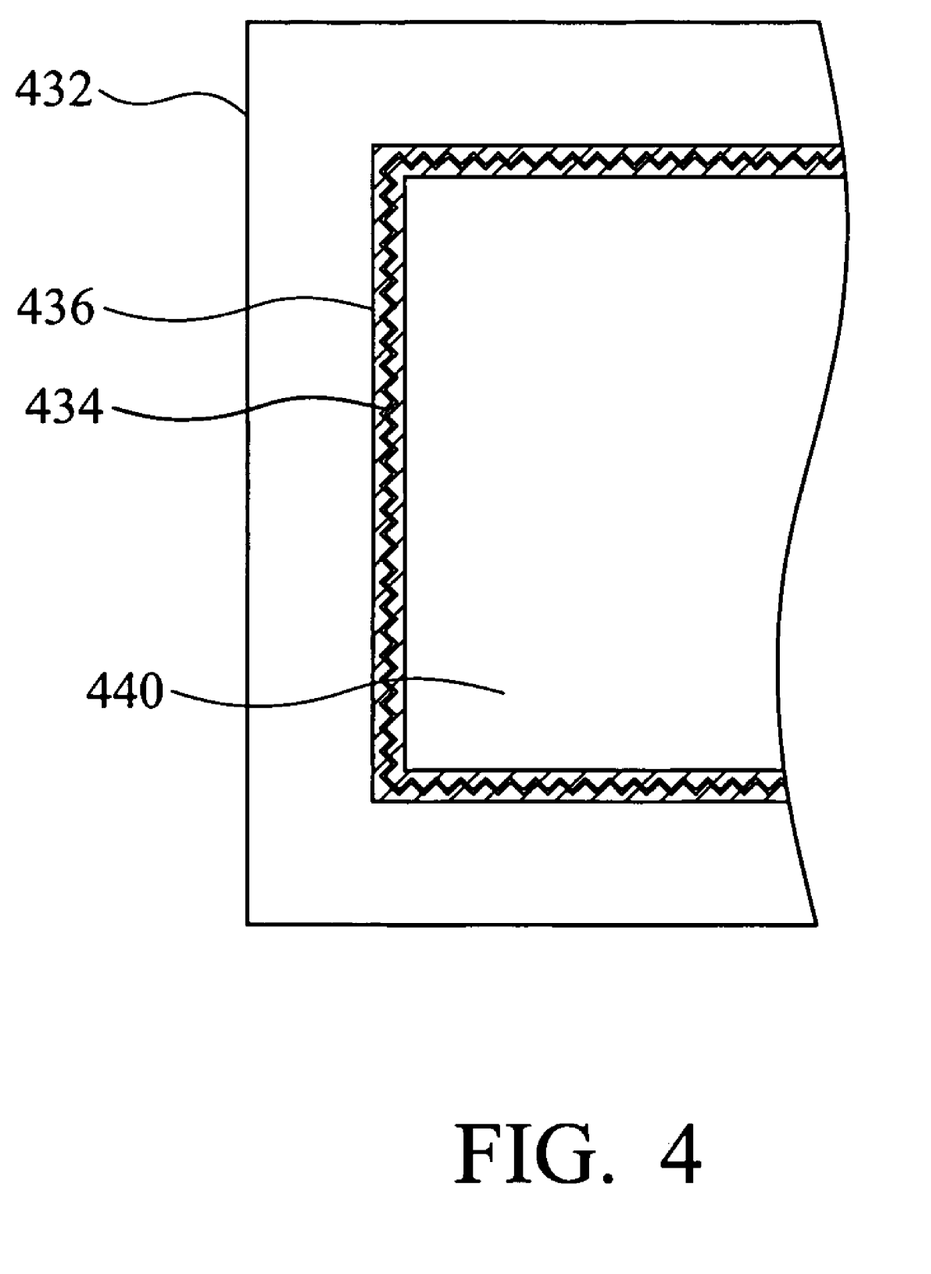
FIGS. 4 and 5 are top views of TFT LCD devices with other types of sealant region according to other embodiments of the invention.
Figure 5:
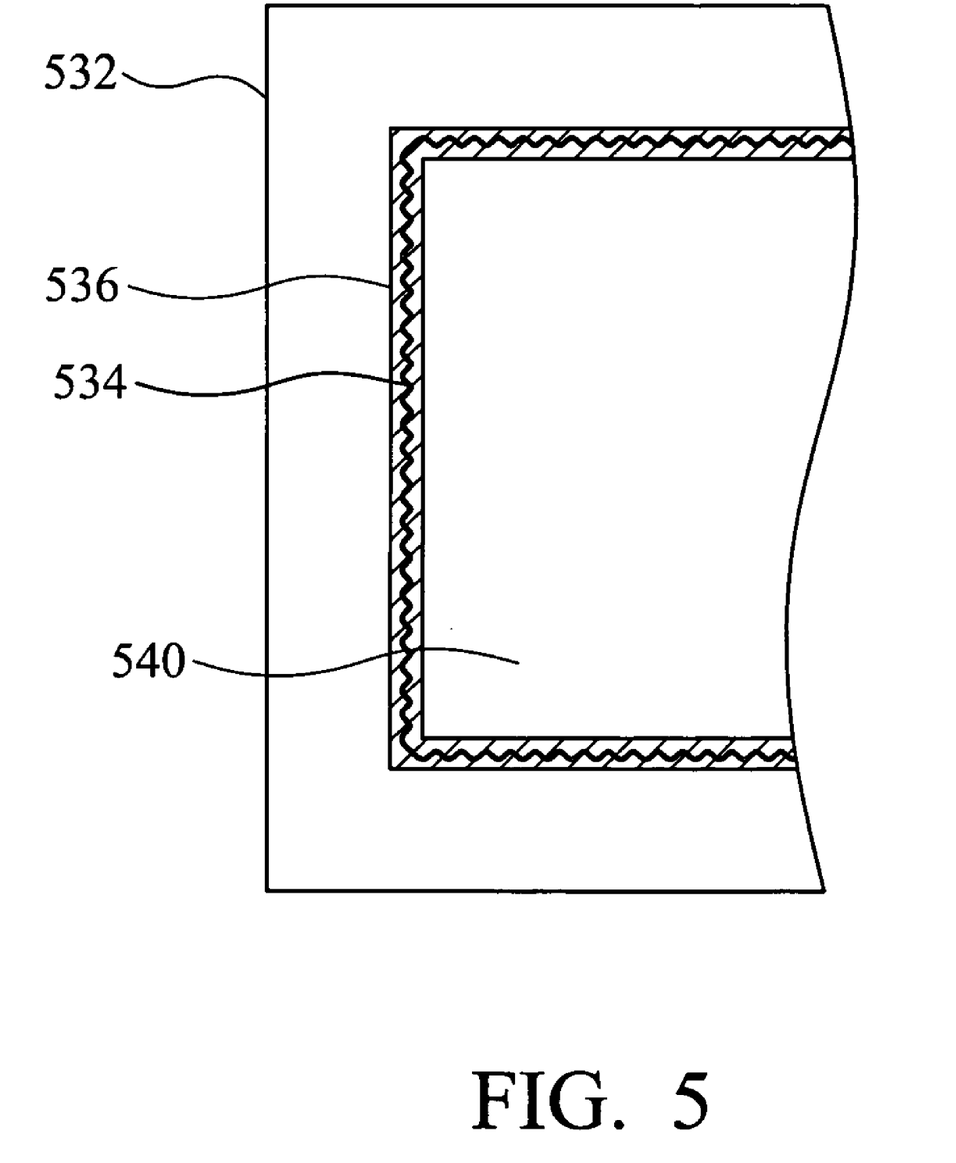

FIGS. 4 and 5 are top views of TFT LCD devices with other types of sealant region according to other embodiments of the invention.

As shown in FIG. 4, a color filter substrate 440 is disposed over a TFT array substrate 432. Openings 434 are formed within a sealant region 436 distributed over the perimeter of the TFT array substrate 432. A sealant encapsulates the TFT LCD device by contacting the color filter substrate 440 and TFT array substrate 432.

As shown in FIG. 5, a color filter substrate 540 is disposed over a TFT array substrate 532. Openings 534 are formed within a sealant region 536 distributed over the perimeter of the TFT array substrate 532. A sealant encapsulates the TFT LCD device by contacting the color filter substrate 540 and TFT array substrate 532.

Although these described embodiments illustrate various patterns of the openings, such as the parallel openings in FIG. 2A, the small segments with the surface feature such as tabs and grooves in FIG. 3A, the modified small segments with the surface feature such as tabs and grooves in FIG. 4, and the modified curved small segments with the surface feature such as tabs and grooves in FIG. 5, they share a common feature of the sealant, placed in these openings, being substantially evenly distributed on both sides of the central axis of the sealant region. In addition, the width of these openings is much smaller than the total width of the sealant region.

The modified curve saw tooth shape in FIG. 5 avoids sharp angle formed by any two openings. In FIG. 2A, the two openings 26a formed in the corner region also balance distribution of the sealant. As shown, some patterns may be asymmetric in a particular local area such as the saw tooth pattern in FIG. 5, but the sealant is balanced substantially along the central axis of either the horizontal or vertical sealant region. The balanced distribution of the sealant in the sealant region reduces problems caused by uneven cell gap, thereby avoiding around gap mura problem.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An encapsulating structure for a liquid crystal display device, comprising:
    a first substrate having a sealant region;
    a second substrate;
    a first material layer disposed on the first substrate;
    a second material layer disposed on the first material layer, wherein the second material layer includes an opening with a continuous saw tooth pattern extending along the sealant region to expose the underlying first material layer; and a sealant disposed on the second material layer in the sealant region and filled into the opening of the second material layer for attaching the second substrate to the first substrate;

wherein the sealant is adapted to contact the first material layer and the second material layer through the opening, and the sealant has substantially flat contact bottom surfaces with the first and the second material layers via the opening with the continuous saw tooth pattern extending along the sealant region.

2. The structure as claimed in claim 1, wherein the opening has a uniform width.

3. The structure as claimed in claim 1, wherein the first material layer comprises an organic polymer material.

4. The structure as claimed in claim 1, wherein the second material layer comprises a dielectric material.

5. The structure as claimed in claim 1, wherein the saw tooth pattern includes a curve saw tooth pattern.

* * * * *